United States Patent
Kollmer et al.

(10) Patent No.: US 6,831,474 B2
(45) Date of Patent: Dec. 14, 2004

(54) APPARATUS AND METHOD FOR TESTING A PLURALITY OF ELECTRICAL COMPONENTS THAT ARE COUPLED TO ONE ANOTHER

(75) Inventors: Ute Kollmer, Munich (DE); Carsten Linnenbank, Munich (DE); Ulrich Schaper, Munich (DE); Roland Thewes, Grobenzell (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/203,179

(22) PCT Filed: Mar. 6, 2001

(86) PCT No.: PCT/DE01/00850

§ 371 (c)(1),
(2), (4) Date: Dec. 30, 2002

(87) PCT Pub. No.: WO01/67507

PCT Pub. Date: Sep. 13, 2001

(65) Prior Publication Data

US 2003/0132754 A1 Jul. 17, 2003

(30) Foreign Application Priority Data

Mar. 10, 2000 (DE) .......................................... 100 11 656

(51) Int. Cl.$^7$ .............................................. G01R 31/28
(52) U.S. Cl. ...................................... 324/765; 324/769
(58) Field of Search ............................. 324/158.1, 73.1, 324/754, 755, 765, 763, 769, 770; 438/14–17; 365/200–201; 714/714, 715, 718

(56) References Cited

U.S. PATENT DOCUMENTS

| 4,956,602 | A | * | 9/1990 | Parrish ........................ 324/537 |
| 4,961,053 | A | * | 10/1990 | Krug ........................... 324/537 |
| 4,972,144 | A | * | 11/1990 | Lyon et al. .................. 324/765 |
| 5,804,960 | A | * | 9/1998 | El Ayat et al. ............... 324/158.1 |
| 6,265,889 | B1 | * | 7/2001 | Tomita et al. ............... 324/765 |

FOREIGN PATENT DOCUMENTS

EP 0891623 2/2000

OTHER PUBLICATIONS

ESSDERC'98, Proceedings of the 28$^{th}$ European Solid–State Device Research Conference, Bordeaux, France, Sep. 8–10, 1998, C. Linnenbank, et al, What Do Matching Results of Medium Area MOSFET's Reveal for Large Area Devices in Typical Analog Applications?, 3 pages.

(List continued on next page.)

*Primary Examiner*—Vinh P. Nguyen
(74) *Attorney, Agent, or Firm*—Altera Law Group, LLC; Jeffrey R. Stone

(57) ABSTRACT

An apparatus and method for testing a plurality of electrical components that are coupled to one another. Further, an electrical selection unit, coupled to the electrical components to be tested, is provided for selecting at least one electrical component to be tested. A parasitic voltage drop in the testing circuit can be at least partially compensated using a control element coupled to the electrical components to be tested. The invention makes it possible, for testing of electrical components on a wafer over a large distance, i.e., several millimeters, to permit automated compensation of interference influences which occur as a result of the lines coupling or connecting the components to be tested.

9 Claims, 2 Drawing Sheets

OTHER PUBLICATIONS

M. Elsele, et al, Intra–Die Device Parameter Variations and Their Impact on Digital CMOS Gates at Low Supply Voltages, 1995 IEEE, IEDM 95–67, Sep. 1995, pp. 3.4.1–3.4.4.

K.R. Lakshmikumar, et al, Characterization and Modeling of Mismatch in MOS Transistors for Precision Analog Design, IEEE Journal of Solid–State Circuits, vol. SC–21, No. 6, Dec. 1986, pp. 1057–1066.

International Electron Devices meeting, 1998, San Francisco, CA, Dec. 6–9, 1998, M.J.M. Palgrom, et al, Transistor matching in analog CMOS applications, 1998 IEEE, 5 pages.

Thewes, et al, Explanation and Quantitative Model for the Matching Behavior of Poly–Silicon Resistors, IEEE, IEDM 1998, Dec., 6–9 pp. 771–774, XP002170198 San Francisco, CA, p. 771, left–hand column, paragraph 3; figure 1.

* cited by examiner

APPARATUS AND METHOD FOR TESTING A PLURALITY OF ELECTRICAL COMPONENTS THAT ARE COUPLED TO ONE ANOTHER

BACKGROUND OF THE INVENTION

The invention relates to a test circuit arrangement and a method for testing a plurality of electrical components which are coupled to one another.

Such a test circuit arrangement and such a method are known from [1] and [2].

DESCRIPTION OF THE RELATED ART

When manufacturing semiconductor components, in particular when manufacturing chips on wafers, there is frequently the problem that, owing to the local arrangement of individual circuit elements on the wafer and owing to different conditions during the manufacture of the wafer, the circuit elements which are of the same type on the wafers have different properties.

A customary electrical circuit element which is used in the field of semiconductor technology is a transistor, in particular an MOS field-effect transistor.

If the MOS field-effect transistors are used in analog circuits, there is often a need for the most precise knowledge possible of the properties of the circuit elements which are manufactured during a specific manufacturing process under predefined manufacturing conditions, and thus for the most precise knowledge possible of their behavior in an analog circuit.

Owing to the abovementioned differences and irregularities during the manufacturing process of a wafer, the transistors even within one chip often have very different properties.

These different properties of the transistors are usually referred to as mismatching of the (MOS) field-effect transistors.

If a circuit designer has no precise knowledge of the properties of the respectively used field-effect transistor, this mismatching, that is to say the different properties of the field-effect transistors in a chip or wafer or of transistors of chips or wafers which have been manufactured under the same manufacturing conditions, give rise to considerable uncertainties, in particular in the design of an analog electrical circuit which contains such field-effect transistors.

For this reason, it is necessary to obtain information on the properties of manufactured field-effect transistors.

In order to determine the properties of the transistors, it is possible to use a test structure on a reference wafer which has also been manufactured under the manufacturing conditions to be examined, and has reference transistors.

The properties determined by means of such a test structure for the field-effect transistor or transistors which have been manufactured under the same manufacturing conditions as the reference wafer with the reference field-effect transistors are made available to the circuit designer who can include these properties in his design of a circuit, as a result of which a more reliable and dependable design of an electrical circuit, in particular an analog circuit, with such field-effect transistors is possible.

Basic principles of what is referred to as mismatching are described in [3] and [4].

The test circuit arrangement known from [1] and [2] has transistors which are to be tested and which are arranged in columns and rows in a matrix. A column decoder and a row decoder are coupled to the transistors to be tested and serve together as an address decoder for selecting the transistor to be respectively tested.

Furthermore, selection transistors for uncoupling or selecting the transistors to be tested are connected between the column decoders and row decoders.

Each transistor to be tested is arranged in a diode circuit, that is to say the gate terminal of the field-effect transistor to be tested is short-circuited to its drain terminal.

The test circuit arrangement described in [1] and [2] is used to determine the large-signal response of the field-effect transistors which are to be tested, which are coupled to one another and are arranged at a "large" distance of several mm from one another.

It is not possible to perform automated testing of different electrical components with known test circuit arrangement.

In particular in a test structure of electrical components which are to be tested and which are arranged far apart from one another, for example by several millimeters, parasitic voltage drops, that is to say parasitic effects, occur owing to the electrical connecting lines between the individual electrical components to be tested.

These voltage drops falsify the measurement result and thus the test results, as a consequence of which the results which are provided to a circuit designer for the individual electrical components are imprecise and, in particular when designing analog circuits, said results give rise to unreliable analog circuits which in some cases do not function or lie outside a predefined specification.

In addition, a circuit arrangement with a test circuit is described in [5].

The invention is thus based on the problem of specifying a test circuit arrangement and a method for testing a plurality of electrical components, which test circuit arrangement and method make it possible to test the electrical components to be tested in a more precise and reliable way.

BRIEF SUMMARY OF THE INVENTION

The problem is solved by means of the test circuit arrangement and by means of the method having the features as claimed in the independent patent claims.

A test circuit arrangement for testing a plurality of electrical components has a plurality of electrical components which are to be tested and which are coupled to one another. In addition, an electrical selection unit, coupled to the electrical components to be tested, is provided for selecting at least one electrical component to be tested. A parasitic voltage drop in the test circuit arrangement can be at least partially compensated using a control element which is coupled to the electrical components to be tested.

In a method for testing a plurality of electrical components which are coupled to one another, an electrical selection unit is used to select an electrical component to be tested from the plurality of electrical components to be tested. A test current is conducted through the selected electrical component to be tested or a test voltage is applied to the electrical component to be tested. A measuring current which results from the test current or the test voltage or a resulting measuring voltage is sensed, that is to say measured, and a resulting parasitic voltage drop in the test circuit arrangement is at least partially compensated by means of a control element within the scope of the measurement.

The invention makes it possible for the first time to permit, within the scope of what is known as long-distance mismatching, that is to say within the scope of the testing of electrical components on a wafer over a large distance of several millimeters, automated compensation of interference influences which occur, in particular, as a result of the connecting lines, that is to say the couplings between the components to be tested.

Such a test circuit arrangement is generally arranged along the chips on a reference wafer.

As the entire test structure extends essentially over the entire reference wafer, it is possible to sense changing properties of the electrical components at different positions within the wafer.

In addition, for this reason it is possible to sense changing properties of the electrical components at various positions within a chip.

The invention thus considerably increases the precision of the test results. This leads to significantly improved analog circuits, as they are based on a more reliable description of the properties of the electrical components, said circuits being obtained by means of the electrical components on wafers which have been manufactured according to the same manufacturing method under the same manufacturing conditions as the reference wafer.

Preferred developments of the invention emerge from the dependent claims.

The refinements of the invention described below relate both to the test circuit arrangement and to the method for testing a plurality of electrical components which are coupled to one another.

The electrical components can be:
- at least one transistor, in particular
    - at least one pnp-type bipolar transistor,
    - at least one npn-type bipolar transistor,
    - at least one field-effect transistor, in particular an MOS field-effect transistor (for example NMOS field-effect transistor or PMOS field-effect transistor),
    - generally any type of transistor,
- at least one diode,
- at least one electrical resistor or else
- at least one electrical capacitor.

The electrical components can be arranged in groups of components, each group of components containing the same electrical components. A plurality of groups of components can be arranged in the test circuit arrangement, each group of components being coupled to the electrical selection unit.

The electrical selection unit can have a shift register and a clock generating element for clocking the shift register. The shift register with which the individual couplings, to which the electrical components to be tested are coupled, are addressed can thus easily be used to completely take into account, and thus test, the electrical component which is to be tested within the test circuit arrangement because all the components are executed sequentially by means of the shift register via the connecting lines.

It is to be noted, that alternatively, any desired addressing mechanism can also be provided, for example the selection unit can be formed by means of free addressing registers which are filled by an external control unit with the corresponding addresses of the component to be respectively tested within the plurality of components to be tested.

In one development of the invention there is provision that the control element is an electrical operational amplifier. The inverting input is coupled to a feedback loop, and the non-inverting input of the operational amplifier is coupled to a predefinable potential. The output of the operational amplifier is coupled to a forward coupling. The forward coupling can be coupled to any electrical component to be tested, and also to the feedback loop.

In this way, parasitic voltage drops are produced at the forward coupling, which preferably extends over the entire test circuit arrangement, owing to the "large" distances of several millimeters in the region of the integrated circuits. These voltage drops are compensated, and "automatically" eliminated, by feeding back the forward coupling to the inverting input of the operational amplifier via the feedback loop. Therefore, on the forward coupling, generally on a part of the couplings between the components to be tested, parasitic effects do not have any influence on a resulting measuring current or a resulting measuring voltage, that is to say generally on the test result which is obtained and which respectively characterizes the selected electrical component.

Very efficient compensation of the parasitic voltage drops on at least part of the connecting lines between the individual electrical components to be tested is thus achieved in a simple and cost-effective way.

In addition, an electric voltmeter may be provided which can be coupled to each component to be tested.

According to a further refinement of the invention, a current source is provided which can be coupled to each electrical component to be tested.

In this context it is to be noted that the following have virtually no falsifying influence on the test result: the electrical voltmeter (owing to its large internal resistance), the high-impedance inverting input of the operational amplifier and the current source (owing to its low resistance).

In order to be able to determine changing properties which result in different directions along the wafer, according to one further refinement of the invention there is provision to arrange at least some of the electrical components to be tested in different orientations, preferably perpendicularly with respect to one another, within the test circuit arrangement.

One exemplary embodiment of the invention is illustrated in the figures and will be explained in more detail below. Of said figures:

DETAILED DESCRIPTION OF THE INVENTION

Figure 1:
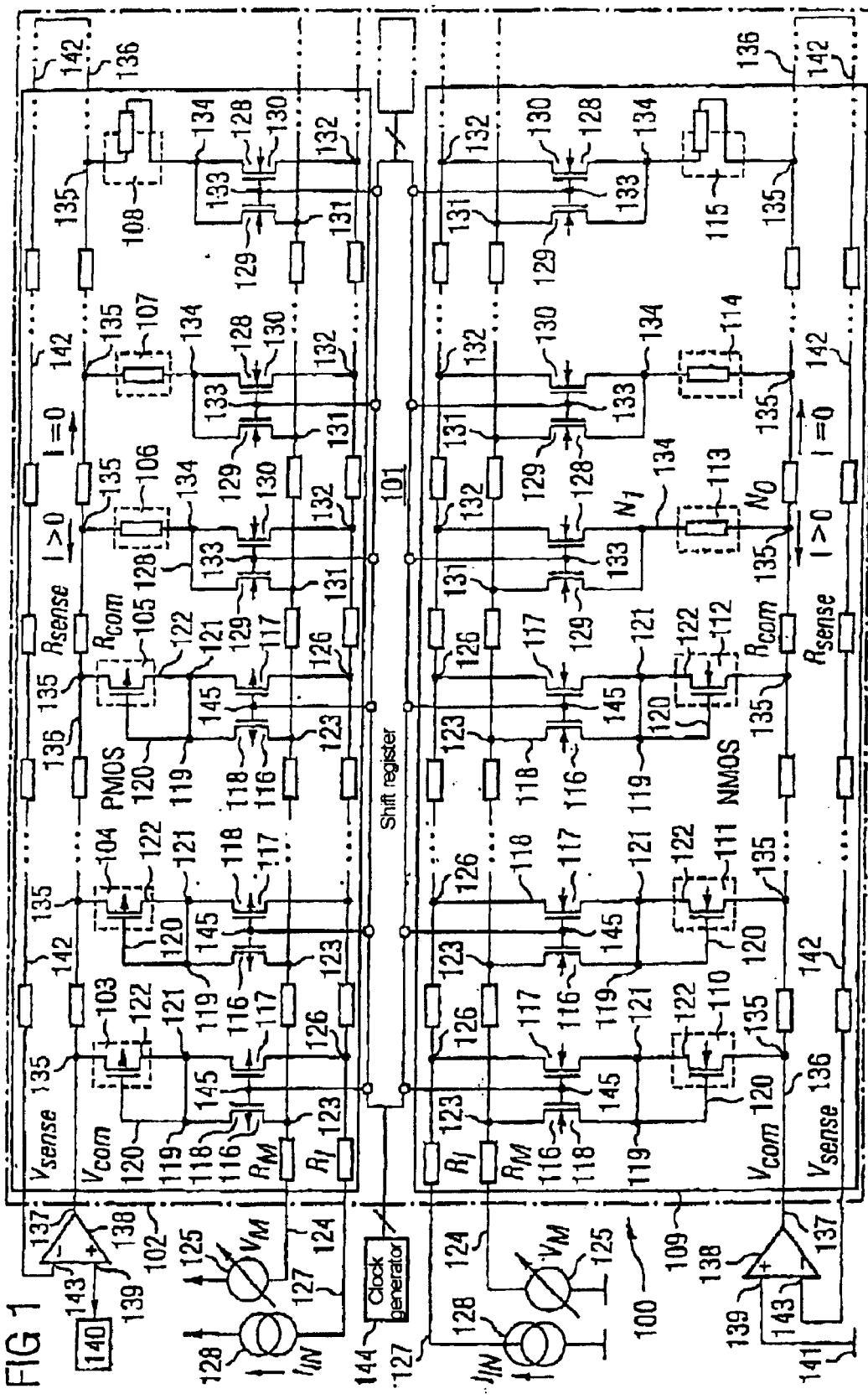
FIG. 1 shows a test circuit arrangement according to an exemplary embodiment of the invention.

FIG. 1 shows a test circuit arrangement 100 with a shift register 101 as an electrical selection unit, and a plurality of groups 102, 109 of components. Each group 102, 109 of components contains a plurality of different electrical components, for example PMOS field-effect transistors, NMOS field-effect transistors, bipolar transistors, diodes, electrical resistors, capacitors, etc.

According to the exemplary embodiment from FIG. 1, the following electrical components to be tested are contained in the first group 102 of components:
- a first PMOS field-effect transistor 103,
- a second PMOS field-effect transistor 104,
- an m-th PMOS field-effect transistor 105, a first electrical resistor 106, a second electrical resistor 107, an n-th electrical resistor 108.

The second group 109 of components contains, according to the exemplary embodiment:

a first NMOS field-effect transistor 110, a second NMOS field-effect transistor 111, an i-th NMOS field-effect transistor 112, an n+1-th electrical resistor 113, an n+2-th electrical resistor 114, and an n+j-th electrical resistor 115.

Each component to be tested is coupled in each case to a selection line of the shift register 101 in the manner described below, which selection line can be addressed unambiguously in each case by the shift register.

With a field-effect transistor as electrical element to be tested, the respective line of the shift register 101 is coupled to the gates of two decoupling transistors, a first decoupling transistor 116 and a second decoupling transistor 117 which form a first decoupling unit 118.

The drain terminal 119 of the first decoupling transistor 116 is coupled to the gate terminal 120 of the respective field-effect transistor 103, 104, 105, 110, 111, 112 to be tested.

The drain terminal 121 of the second decoupling transistor 117 is coupled to the drain terminal 122 of the respective field-effect transistor 103, 104, 105, 110, 111, 112 to be tested.

In addition, both gates are coupled to one address line each of the shift register 101 via a gate terminal 145.

The source terminal 123 of the first decoupling transistor 116 is coupled to a first connecting line 124 as a measuring line. In addition, a voltmeter 125 is coupled to the first connecting line 124. The voltmeter 125 is usually not arranged on the wafer itself, and a terminal 315 (cf. FIG. 3) for connecting the voltmeter 125 is therefore provided in the test circuit arrangement 100 on the chip.

First parasitic resistances $R_M$ through which the parasitic properties of the first connecting line 124, that is to say in particular the voltage drop on the first connecting line 124 owing to a parasitic current flowing through the first connecting line 124 are manifest are illustrated on the first connecting line 124.

Each source terminal 126 of the respective second decoupling transistor 117 is coupled to a second connecting line 127 as current path. A current source 128 which is usually located outside the chip as well and by means of which an impressed current $I_{IN}$ along the second connecting line 127 via the second decoupling transistor 117 is impressed on the drain terminal 122 of the respective field-effect transistor 103, 104, 105, 110, 111, 112 to be tested is coupled to the second connecting line 127.

Second parasitic resistors $R_I$ are illustrated on the second connecting line 127 in order to represent a parasitic voltage drop on the second connecting line 127 through the flow of the impressed current $I_{IN}$ through the second connecting line 127.

The structure of a first decoupling unit 118 which is illustrated above applies to all four-pole elements, in particular to all transistors if they are provided in the test circuit arrangement 100.

In a two-pole element, for example the electrical resistors 106, 107, 108, 113, 114, 115, a second decoupling unit 128 is provided with a field-effect transistor as third decoupling transistor 129 and a field-effect transistor as fourth decoupling transistor 130.

The source terminal 131 of the third decoupling transistor 129 is coupled to the first connecting line 124. The source terminal 132 of the fourth decoupling transistor 130 is coupled to the second connecting line 127.

In addition, the two gates are coupled via a gate terminal 133 to one address line each of the shift register 101.

The drain terminals of the third decoupling transistor 129 and of fourth decoupling transistor 130 are coupled to one another and to a first terminal 134 of the electrical resistor 106, 107, 108, 113, 114, 115.

An output terminal 135 of the respective element to be tested, that is to say of the electrical component to be tested, in the case of a field-effect transistor 103, 104, 105, 110, 111, 112 the source terminal of the field-effect transistor, and in the case of an electrical resistor, that is to say generally of a two-poled element, its second terminal, is coupled in each case to a common reference potential, referred to below as forward coupling 136, using a third connecting line 136 as what is referred to as a common ground connecting line.

Figure 3:
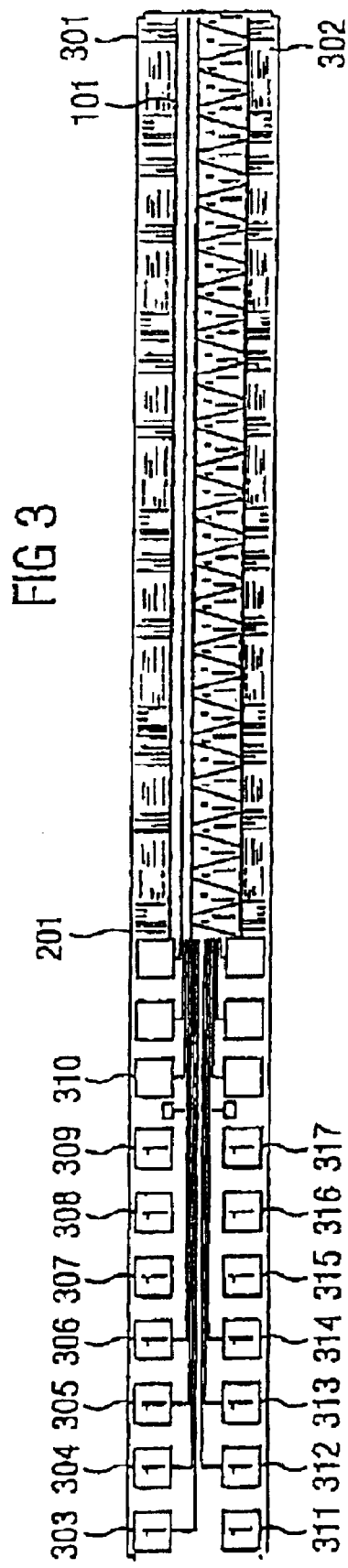
FIG. 3 shows an outline of the entire test circuit arrangement with external terminals for actuating it.

The forward coupling 136 is coupled at one of its ends to an output 137 of an operational amplifier 138. The operational amplifier 138 is usually also arranged outside the chip, and the forward coupling 136 is thus coupled to a terminal which is illustrated in FIG. 3.

The non-inverting input 139 of the operational amplifier 138 is coupled to a predefined operating voltage $V_{DD}$ 140 or to the ground potential 141. In addition, the other end of the forward coupling 136 is coupled to a feedback loop 142 as the sensing line. The feedback loop 142 is fed back to the inverting input 143 of the operational amplifier.

In addition, third parasitic resistors $R_{COM}$ which describe the parasitic properties of the forward coupling 136 are illustrated in FIG. 1.

Fourth parasitic resistors $R_{sense}$ are illustrated on the feedback loop 142 in order to represent the parasitic behavior of the feedback loop 142.

This structure for a group of components is the same for all the groups 102, 109, ... of components which are located in the test circuit arrangement 100, basically for as many groups of components as desired.

The voltage drops of the at the third parasitic resistors $R_{COM}$ are at least for the most part automatically compensated by the feedback loop 142 using the operational amplifier 138 as the control element.

Therefore, a very simple test circuit arrangement 100 is specified for which a large number of electrical components to be tested can be examined automatically with respect to their properties, that is to say can be tested.

By suitable driving of the shift register 101, the column connections contained in the test circuit arrangement 100, or in the case of two-dimensional arrangement of the line connections contained groups 102, 109 of components are actuated successively one after the other.

The shift register 101 is clocked, that is to say controlled, by means of a clock generator 144.

As is apparent from FIG. 1, the n-th electrical resistor 108 and the n+j-th electrical resistor 115 are arranged essentially perpendicularly thereto with respect to the other electrical resistors 106, 107, 113, 114 in order to determine changing properties of electrical components arranged with different orientations within the chips or wafer.

Figure 2:
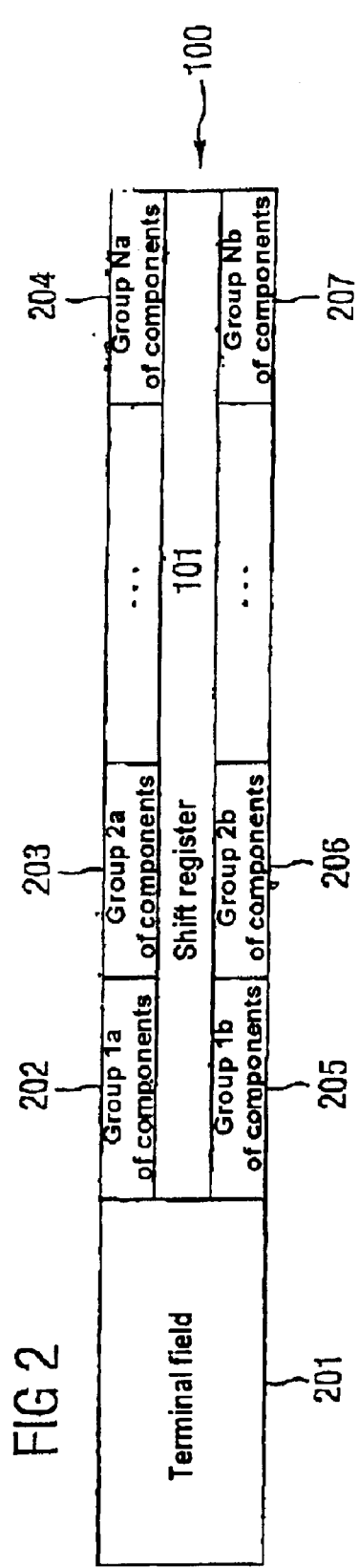
FIG. 2 shows a block diagram of the test circuit arrangement with a plurality of groups of components according to an exemplary embodiment of the invention.

FIG. 2 shows the test circuit arrangement 100 with a terminal field 201 and the groups 202, 203, 204, 205, 206, 207 of components which are each coupled to the shift register 101, and in each case two groups 202, 205 or 203, 206 or 204, 207 of components are arranged opposite the shift register 101.

The terminal field 201 has, as illustrated in FIG. 3, terminals for actuating the test circuit arrangement 100 for each row 301, 302 of components:

- a first terminal 303 is used to connect a voltage supply with which the reference potential $V_{DD}$ is made available,
- a second terminal 304 is used to connect the current source 132 of the upper row 301 of components,
- a third terminal 305 is used to connect the voltmeter 129 of the upper row 301 of components,
- a fourth terminal 306 is used to connect the output 136 of the operational amplifier 138 of the upper row 301 of components,
- a fifth terminal 307 is used to connect the non-inverting input 139 of the operational amplifier 138 of the upper row 301 of components,
- a sixth terminal 308 is used to supply a resetting signal for resetting the shift register 101,
- a seventh terminal 309 and an eighth terminal 310 are used to supply control signals, that is to say to supply signals for shifting the selection bits in the shift register 101 in order to select the respective electrical components to be tested,
- a ninth terminal 311 is used to connect the power source 128 of the lower row 302 of components,
- a tenth terminal 312 is used to connect the voltmeter 125 of the lower row 302 of components,
- an eleventh terminal 311 is used to connect the output 137 of the operational amplifier 138 of the lower row 302 of components,
- a twelfth terminal 314 is used to connect the inverting input 143 of the operational amplifier 138 of the lower row 302 of components,
- a thirteenth terminal 315 is used to connect a voltage supply with which the operating potential $V_{SS}$ is made available,
- a fourteenth terminal 316 is used to connect a voltage supply with which a predefinable potential is made available to the respective substrate material,
- a fifteenth terminal 317 is used to connect a voltage supply with which a predefinable potential is made available to the respective well terminals.

In this document the following publications are cited:

[1] C. Linnenbank et al., What Do Matching Results of Medium Area MOSFETs Reveal for Large Area Devices in Typical Analog Applications?, Proceedings of the 28th European Solid-State Device Research Conference, ESS-DRC 1998, Bordeaux, France, pp. 104–107, Sep. 8–10, 1998.

[2] M. Eisele et al., Intra-Die Device Parameter Variations and Their Impact on Digital CMOS Gates at Low Supply Voltages, IEEE, IEDM 1995, pp. 67–70, 1995.

[3] K. R. Lakshmikumar et al., Characterization and Modeling of Mismatch in MOS Transistors for Precision Analog Design, IEEE Journal of Solid-State Circuits, Vol. SC-21, No. 6, pp. 1057–1066, December 1986.

[4] M. J. M. Pelgrom et al., Transistor Matching in Analog CMOS Applications, IEEE, International Electron Devices Meeting, San Francisco, Calif., IEDM 98, pp. 915–918, Dec. 6–9, 1998.

[5] EP 0 891 623 B1

LIST OF REFERENCE SYMBOLS

100 Test circuit arrangement
101 Shift register
102 First group of components
103 Field PMOS field-effect transistor
104 Second PMOS field-effect transistor
105 m-th PMOS field-effect transistor
106 First electrical resistor
107 Second electrical resistor
108 n-th electrical resistor electrical resistor
109 Second group of components
110 First NMOS field-effect transistor
111 Second NMOS field-effect transistor
112 i-th NMOS field-effect transistor
113 n+1-th electrical resistor
114 n+2-th electrical resistor
115 n+j-th electrical resistor
116 First decoupling transistor
117 Second decoupling transistor
118 First decoupling unit
119 Drain terminal of first decoupling transistor
120 Gate terminal field-effect transistor
121 Drain terminal second decoupling transistor
122 Drain terminal field-effect transistor
123 Source terminal first decoupling transistor
124 First connecting line (measuring line)
125 Voltmeter
126 Source terminal second decoupling transistor
127 Second connecting line (current path)
128 Current source
129 Third decoupling transistor
130 Fourth decoupling transistor
131 Source terminal of third decoupling transistor
132 Source terminal of fourth decoupling transistor
133 Gate terminal of third/fourth decoupling transistor
134 First terminal of electrical resistor
135 Output terminal
136 Forward coupling (common ground)
137 Output operational amplifier
138 Operational amplifier
139 Non-inverting input operational amplifier
140 Operating voltage
141 Ground potential
142 Feedback loop (sensing line)
143 Inverting input operational amplifier
144 Clock generator
145 Gate terminal of first/second decoupling transistor
$R_M$ First parasitic resistors
$R_I$ Second parasitic resistors
$R_{COM}$ Third parasitic resistors
$R_{sense}$ Fourth parasitic resistors
201 Terminal field
202 Group of components
203 Group of components
204 Group of components
205 Group of components
206 Group of components
207 Group of components
301 Upper row of components
302 Lower row of components
303 First terminal
304 Second terminal
305 Third terminal
306 Fourth terminal
307 Fifth terminal
308 Sixth terminal
309 Seventh terminal 310 Eighth terminal
311 Ninth terminal
312 Tenth terminal
313 Eleventh terminal
314 Twelfth terminal
315 Thirteenth terminal
316 Fourteenth terminal
317 Fifteenth terminal

What is claimed is:

1. A test circuit for testing a plurality of electrical components, the test circuit arrangement comprising:

a plurality of electrical components which are to be tested and which are coupled to one another;

an electrical selection unit, coupled to the electrical components to be tested, for selecting at least one electrical component to be tested; and a control element which is coupled to the electrical components to be tested and with which a parasitic voltage drop in the connecting lines of the selected electrical component to be tested can be at least partially compensated.

2. The test circuit arrangement as claimed in claim 1, in which the electrical components are:

at least one transistor; or at least one diode; or at least one electrical resistor; or at least one electrical capacitor.

3. The test circuit arrangement as claimed in claim 1, in which the electrical components are arranged in groups of components, each group of components containing the same electrical components, and in which a plurality of groups of components are arranged in the test circuit arrangement.

4. The test circuit arrangement as claimed in claim 1, in which the electrical selection unit has a shift register with which the electrical components can be selected.

5. The test circuit arrangement as claimed in claim 1, in which the control element is an electrical operational amplifier, the electrical operational amplifier further comprising:

an inverting input that is coupled to a feedback loop;

a non-inverting input that is coupled to a predefinable potential;

an output that is coupled to a forward coupling; and it being possible to couple the forward coupling to any electrical component to be tested and to the feedback loop.

6. The test circuit arrangement as claimed in claim 1, further comprising an electrical voltmeter which can be coupled to each electrical component to be tested.

7. The test circuit arrangement as claimed in claim 1, further comprising a current source which can be coupled to each electrical component to be tested.

8. The test circuit arrangement as claimed in claim 1, in which the electrical components to be tested are arranged at least partially with different orientations.

9. A method for testing a plurality of electrical components which are coupled to one another, the method comprising:

selecting an electrical component to be tested from the plurality of electrical components to be tested by means of an electrical selection unit;

conducting a test current through the selected electrical component to be tested or applying a test voltage to the electrical component to be tested;

measuring a measuring current which results from the test current of the test voltage or a resulting measuring voltage; and at least partially compensating for a resulting parasitic voltage drop in the connecting lines of the selected electrical component to be tested is by means of a control element.

* * * * *